US007161171B2

(12) United States Patent
Dahmani et al.

(10) Patent No.: US 7,161,171 B2
(45) Date of Patent: Jan. 9, 2007

(54) MATERIAL FOR USE IN THE MANUFACTURING OF LUMINOUS DISPLAY DEVICES

(75) Inventors: Brahim Dahmani, Bourron Marlotte (FR); Guillaume Guzman, Veneux-les-Sablons (FR); Michel André Aegerter, St. Ingbert (DE); Jörg Pütz, Dudweiler (DE)

(73) Assignee: Corning Incorporated, Corning, NY (US)

( * ) Notice: Subject to any disclaimer, the term of this patent is extended or adjusted under 35 U.S.C. 154(b) by 158 days.

(21) Appl. No.: 10/654,462

(22) Filed: Sep. 2, 2003

(65) Prior Publication Data

US 2004/0113146 A1 Jun. 17, 2004

(30) Foreign Application Priority Data

Sep. 3, 2002 (FR) .................................. 02 10865

(51) Int. Cl.
*H01L 35/24* (2006.01)
*H01L 51/00* (2006.01)

(52) U.S. Cl. ............................. 257/40; 257/43; 257/79; 257/E51.001; 257/E51.018; 257/E51.022

(58) Field of Classification Search .................. 257/40, 257/43, 79, E51.001, E51.018, E51.022, 257/E51.122
See application file for complete search history.

(56) References Cited

U.S. PATENT DOCUMENTS

| 4,140,937 A | 2/1979 | Vecht et al. ................. 313/503 |
| 4,719,152 A * | 1/1988 | Ohta et al. ................... 428/432 |
| 5,714,838 A | 2/1998 | Haight et al. |
| 5,885,498 A | 3/1999 | Matsuo et al. ............... 252/583 |
| 5,986,391 A | 11/1999 | Feldman ..................... 313/326 |
| 5,998,802 A | 12/1999 | Struye et al. |
| 6,087,730 A | 7/2000 | McGarvey et al. |
| 6,259,202 B1 | 7/2001 | Sturm et al. |
| 6,262,441 B1 | 7/2001 | Bohler et al. |
| 6,268,059 B1 | 7/2001 | Cronin et al. ............... 428/432 |

FOREIGN PATENT DOCUMENTS

| EP | 0010786 | 9/1979 |
| EP | 0 817 540 | 1/1998 |
| JP | 04028114 | 1/1992 |
| JP | 05-41285 | 2/1993 |

(Continued)

OTHER PUBLICATIONS

D. Vaufrey et al., "Sol Gel Deposited Sb Doped SnO2 as Transparent Anode for OLED: Process, Patterning and Hole Injection Characteristics", Proc. SPIE, vol. 4464, pp. 103-112.

*Primary Examiner*—Kenneth Parker
*Assistant Examiner*—Joseph Nguyen
(74) *Attorney, Agent, or Firm*—Kevin M. Able; Thomas R. Beall

(57) ABSTRACT

A material including a glass or vitroceramic substrate having a first layer and a second layer deposited thereon, each of the first and second layers including at least one transparent conducting oxide (TCO). The first layer has a roughness of more than 1 nm and the second layer has a roughness less than or equal to 1 nm. A transmittance in the visible wavelength range of the material is at least 80%. The work function of the second layer is greater than the work function of the first layer and is greater than 4.6 eV.

12 Claims, 1 Drawing Sheet

| | FOREIGN PATENT DOCUMENTS | | WO | WO97/48115 | 6/1997 |
|---|---|---|---|---|---|
| JP | 09063771 | 3/1997 | WO | WO01/15244 | 8/2000 |
| JP | 2000108244 | 4/2000 | WO | WO01/45182 | 12/2001 |
| JP | 2002-100483 | 4/2002 | | | |

* cited by examiner

MATERIAL FOR USE IN THE MANUFACTURING OF LUMINOUS DISPLAY DEVICES

RELATED APPLICATION

This application claims the benefit of priority from French Patent Application No. 02-10865, Filed Sep. 3, 2002, the content of which is incorporated herein by reference.

FIELD OF INVENTION

The invention relates to a material for use in the manufacturing of luminous display devices, in particular organic light emitting diodes. The invention also relates to display devices, in particular to organic light emitting diodes incorporating this material, as well as a process for the preparation of these materials.

BACKGROUND

Display devices, and in particular display screens, are currently undergoing many developments. Organic light emitting diodes, known as OLEDs, constitute a technology that has given rise to more luminous, less expensive and more effective display modules and will doubtless form the basis of the next generation of luminous screens. Nevertheless, this technology which should in principle be applicable in particular in the development of flat screens, is not yet sufficiently reliable and well understood. It should be recalled that a basic OLED cell consists of stacked, thin organic layers sandwiched between a transparent anode and a metal layer acting as a cathode.

Conventionally, the organic layers include a hole injecting layer, hole transporting layer, a photon-emitting layer and an electron transport layer. When a suitable current is applied to an OLED cell, the positive and negative charges recombine in the emitting layer to produce light. The structure of the organic layers and the type of anode and cathode used are chosen to maximise the recombination process in the emitting layer, which also improves light emission from the OLED device. OLED type display devices thus also lead to better presentation of information on lighter and less bulky screens. OLED technology is currently undergoing rapid developments but is still plagued by a number of difficulties.

One of the main approaches to developing OLED type diodes at present makes use of an indium oxide layer doped with tin ($In_2O_3$:Sn), generally known by the abbreviation ITO, as a transparent conducting layer acting as the anode. It is well known in the art that this ITO layer, deposited directly on the substrate and acting as an anode, has the advantages of excellent conduction and very good transparency, but unfortunately has the drawback, essentially because of the technology used to deposit it on glass substrates, of having a very rough surface which detracts from good functioning of the OLED device since this results in considerable heterogeneity in current density and even causes short circuits.

Another drawback of OLED type devices with an ITO layer is the tendency of indium atoms in the ITO layer to migrate under the effect of an electric field.

In addition, a drawback of the ITO layer is its low work function.

Numerous studies have been conducted to date in an attempt to resolve some of these drawbacks, at the same time as attempting to improve work function within the OLED cell without impairing anode conductivity too greatly.

In an attempt to reduce the roughness of the transparent layer deposited on the substrate, European application EP 0010786 therefore proposes subjecting the substrate to chemical treatment intended to diminish its roughness.

International application WO 0145182 suggests modifying the process for depositing the ITO layer in order to decrease surface roughness.

Different documents propose treating the ITO layer with plasma, as is the case, in particular, in international application WO 97/48115 and American patent U.S. Pat. No. 6,259,202.

International application WO 97/48115 proposes improving work function by treating the ITO layer with plasma.

American patent U.S. Pat. No. 6,262,441 describes using a semi-transparent metal layer in order to improve work function.

International application WO 01/15244 describes using an intermediate layer of a partially oxidized metal for substantially protecting the organic layers of the OLED cell from oxidation in the course of deposition of the ITO layer.

International application WO 99/13692 describes OLED type materials in which one or more polymer layers are inserted between the anode and the light emitting layers in order to increase work function. Similarly, patents U.S. Pat. No. 5,998,803, U.S. Pat. No. 5,714,838 and U.S. Pat. No. 6,087,730 describe OLED type devices containing an organic layer between the anode and the light emitting layers.

All the devices in the above-cited documents are aimed at reducing at least one of the known drawbacks of using ITO layers and, in particular at reducing the surface roughness of this layer and increasing the work function.

Consequently, all the above-cited documents attempt to improve the functioning of OLED devices by eliminating at least one of the above-mentioned drawbacks.

Among the devices cited in the literature, those that appear to be of particular interest contain a transparent ITO anode and organoluminescent layers, a conducting organic layer, in particular a layer having a doped polymer, such as poly(ethylenedioxy)thiophene, known as PEDOT, which improves the efficiency of the hole injection layer and reduces the unfavourable effect of roughness of the ITO layer.

Nevertheless, organic polymers, even if encapsulated, have the drawback of limited chemical stability and fairly low conductivity (typically about 1 to $5.10^{-2}$ $\Omega$.cm versus $10^{-4}$ $\Omega$.cm for ITO).

SUMMARY OF THE INVENTION

It occurred to the inventors of the present invention that by replacing this polymer layer in OLED type devices containing a layer of conducting polymer between the ITO anode and the light emitting layers, with a layer having a transparent conducting oxide with a higher work function than ITO, one would make it possible to eliminate all the known drawbacks of the prior art concerning the use of ITO layers.

More precisely, it was found that a layer of such a conducting transparent oxide, particularly one deposited by means of a sol-gel type process, reduced surface roughness considerably and that by suitably selecting the conducting transparent oxide it would be possible to obtain considerably higher work function than achieved with an intermediate organic layer, as well as avoiding problems related to lack of chemical stability of the organic layers, particularly the risk of oxidation during use.

In addition, it was found that by suitably choosing the transparent conducting oxide, it was possible to greatly limit the migration of indium originating from the ITO layer under the effect of an electric field, the conducting oxide layer acting as a shield to prevent migration.

Another benefit of using such a transparent conducting oxide layer is consequently that it forms a shield against the migration of indium originating from the ITO layer on account of the electric field generated when the device is used.

Pursuing their studies in this field, the inventors of this invention found that the same concept of deposition, on a rough surface having a first transparent conducting metal oxide, of a layer essentially comprised of a second transparent conducting oxide with a greater work function than that of the first conducting oxide layer, could be extended to transparent oxides other than ITO and made it possible to avoid the drawbacks of any rough metal oxide layer used as an anode for an OLED type device, by depositing on its surface a second layer of another transparent conducting metal oxide with a work function between that of the first layer used as an anode and the light emitting layers.

Moreover, by suitably selecting the two types of metal oxide, it is possible to form, by means of the second metal oxide layer, a shield against the migration of atoms originating from the first layer due to an electric field.

Other advantages and characteristics of the invention will become apparent from the description which follows and with reference to FIGS. 1 and 2 which are schematic representations of:

DETAILED DESCRIPTION OF THE INVENTION

According to a first aspect, the present invention thus relates to a new sandwich type material having a transparent substrate, more particularly a glass or vitroceramic substrate, covered with two transparent conducting oxide layers chosen mainly for their transparency and their roughness and work function values respectively.

According to a second aspect, the invention relates to luminous display devices, and in particular to OLED type diodes incorporating this material.

According to a third aspect, the invention relates to a process for manufacturing such a material.

According to one of its fundamental characteristics, the invention relates to a material having:
  a glass or vitroceramic substrate,
  a first layer deposited on one side of said substrate and having at least one transparent conducting oxide, simple or mixed, doped or not, said layer being hereinafter called the TCO layer,
  a second layer deposited on said first TCO layer and having at least one transparent conducting oxide, simple or mixed, doped or not, said layer being hereinafter called the second TCO layer,
  both TCO layers being such that:
  said first TCO layer has a roughness of more than 1 nm and said second TCO layer has a roughness less than or equal to 1 nm,
  transmittance in the visible range of the product having the first and second TCO layers is equal to at least 80% and
  the work function of said second TCO layer is greater than the work function of said first TCO layer and is greater than 4.6 eV and, preferably, greater than 4.8 eV.

Figure 1:
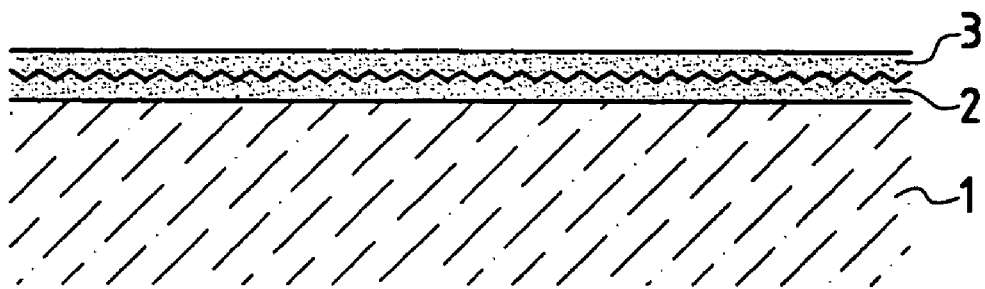
FIG. 1 is a schematic representation of a material according to the present invention. The drawing is not to scale.

Such a material is very schematically represented in FIG. 1.

It is a sandwich type material having a glass or vitroceramic substrate 1.

This substrate is coated with a first layer 2 of a transparent conducting oxide with a high surface roughness. This roughness is drawn in a simplified manner in the sketch diagram of FIG. 1 as a broken line at the interface between TCO layer 2 and the second TCO layer 3.

This first transparent conducting oxide layer is generally deposited on a substrate by a conventional vacuum spraying process or by chemical vapor deposition (CVD).

This type of deposition for a given oxide type generally results in excellent conduction properties but also leads to a relatively high surface roughness, as is known in the art.

The second conducting layer 3 deposited on the first layer 2 enables smoothing of the surface obtained and it is chosen so as not to significantly degrade electrical conductivity or transparency.

Without this being in any way limiting, a second conducting oxide layer is advantageously deposited by a sol-gel type process to achieve a roughness less than or equal to 1 nm.

Moreover, in order to take into account the principal use of the materials of this invention, the work function of two successive TCO layers is chosen so that the work function of the second layer is greater than the work function of the first layer and that the work function of the second layer is greater than 4.6 eV and preferably greater than 4.8 eV.

Both successive TCO layers essentially consist of at least one oxide in the form of a simple or mixed oxide or a mixture of oxides of at least one metal selected from the group includes tin, zinc, indium and cadmium, combined if necessary with at least one element from the group consisting essentially of gallium, antimony, fluorine, aluminum, magnesium and zinc, said element entering into the composition of said mixed oxide or said mixture of oxides or acting as a doping agent for said oxide.

These oxides can be simple or mixed oxides or mixtures of oxides.

Examples of mixed oxides include:
  Ga—In—O
  Ga—In—Sn—O
  Zn—In—O
  Zn—In—Sn—O
  Sb—Sn—O
  Zn—Sn—O
  Mg—In—O
  Cd—In—O
  Cd—Sn—O
  Cd—Sn—In—O
which are all mixed oxides of at least one metal selected from the group including zinc, indium and tin.

Examples of doped oxides include tin oxide doped with fluorine ($SnO_2$:F) or tin oxide doped with antimony ($SnO_2$:Sb) or indium oxide doped with tin ($In_2O_3$:Sn), also called ITO.

According to a particularly advantageous variant of the invention, the first TCO layer includes as an essential constituent:
  indium oxide doped with tin ($In_2O_3$:Sn), also called ITO tin oxide doped with fluorine ($SnO_2$:F), also called FTO
zinc oxide doped with aluminum (ZnO:Al), also called AZO
tin oxide doped with antimony ($SnO_2$:Sb), also called ATO As explained above, the anode of the most commonly described OLED type devices consists of ITO which has excellent electrical conductivity but, because of its surface roughness, presents drawbacks in terms of use in display devices as this surface roughness can cause short-circuits which detract from good diode functioning.

In spite of these drawbacks and because of the benefit of using a second layer of TCO, which enables smoothing of the first TCO layer, ITO remains the preferred transparent conducting oxide for manufacturing the first TCO layer of the material according to the invention.

Thus, according to a particularly advantageous variant of the invention, the material comprises a first TCO layer having ITO and a second TCO layer with a work function greater than 4.6 eV and preferably greater than 4.8 eV.

In this case, the oxide chosen to make up the second TCO layer is advantageously chosen from the group comprised of:
$SnO_2$
$SnO_2$:F
$SnO_2$:Sb
$In_4Sn_3O_{12}$
$Zn_2In_2O_5$
$ZnSnO_3$
$Zn_2SnO_4$
$GaInO_3$
$MgIn2O4$ This second TCO layer makes it possible to even out the first layer and thus obtain a second layer with a surface roughness of less than 1 nm.

Moreover, the type of second TCO layer chosen can limit the migration of indium atoms from the ITO layer due to electric field effects and thus constitutes a real chemical barrier to this migration.

All or at least part of the benefits described above can be achieved by using a first ITO layer overlaid with a second transparent conducting oxide layer chosen from the list above.

It is remarkable to note that the different materials mentioned above, used as a second TCO layer when the first layer is a ITO layer, in spite of a relatively high resistivity, higher than that of the ITO layer (generally between $10^{-4}$ $\Omega.cm$ and $3.10^{-4}$ $\Omega.cm$), make it possible to obtain materials that are perfectly acceptable in terms of conductivity.

The table below gives examples of transparent conducting oxides that can be used as a second TCO layer when the first layer is an ITO layer and their work function and resistivity values.

| TCO | Work function eV | Resistivity $\Omega \cdot cm\ 10^{-4}$ |
| --- | --- | --- |
| $SnO_2$ | 4.84 | 3–8 |
| $SnO_2$:F | 4.9 | 2–5 |
| $SnO_2$:Sb | 5 | 20 |
| $In_4Sn_3O_{12}$ | 4.9 | 2 |
| $Zn_2In_2O_5$ | 4.95 | 3–4 |
| $ZnSnO_3$ | 5.3 | 40 |
| $Zn_2SnO_4$ | 53 | 40 |
| $GaInO_3$ | 5.4 | 27 |

A particularly suitable material for the various functions required is tin oxide doped with antimony ($SnO_2$:Sb), hereafter called ATO.

The choice of the two successive layers, first ITO layer and second ATO layer, provides an excellent alternative to diodes incorporating an organic-polymer hole injection layer.

The properties of the ATO layer are of particular interest because it has a work function of over 4.8 eV, very similar to the work function of organoluminescent layers (generally 5.2 eV), and forms an excellent chemical barrier to indium migration.

Moreover, a single ATO layer deposited by a sol-gel type process from a precursor solution on an ITO layer makes it possible to considerably reduce the surface roughness of the ITO layer.

In addition, as can easily be seen from the examples, the material having a glass substrate covered with an ITO layer and an ATO layer can be used for constructing an OLED type device as an effective anode in order to inject holes.

More precisely, the advantages of the device with an ITO layer deposited directly on a glass or vitroceramic substrate coated with an ATO layer are as follows:

The second ATO layer can be deposited by a sol-gel type process leading to very low surface roughness, ATO work function is higher than that of ITO and is similar to that of organoluminescent layers, The ATO layer is more chemically stable than ITO. It can therefore act as a chemical barrier to the migration of indium towards the organic layers, ATO is more chemically stable than conventional hole injection layers, such as PEDOT or other polymers, The use of two successive layers of a transparent conducting metal oxide means an organic injection layer does not have to be used, The substrate and ATO/ITO are ready to use for the preparation of OLED type devices.

The thickness of the various layers of sandwich material of this invention obviously depends on the application of the material.

Nevertheless, generally speaking, the transparent glass or vitroceramic substrate advantageously has a thickness between 0.1 and 3 mm.

This thickness is advantageously chosen so that it is under 1 mm for OLED type materials.

The first TCO layer is generally, without being limited thereto, between 100 and 150 nm thick, a similar thickness to the ITO layers currently used as a transparent anode in OLED type devices.

The second TCO layer advantageously has a thickness between 30 and 200 nm, preferably between 50 and 150 nm.

As explained previously, the materials described above are particularly suited to applications where they are used as the anode side of luminous display devices.

As examples of such luminous display devices, we may cite any of the numerous types of luminous display screens, regardless of their size, especially mobile phone, television and computer screens.

Luminous display devices more particularly include organic light emitting diodes (OLED) in which the material of the invention constitutes the anode side and is overlaid with electroluminescent layers and a cathode.

Figure 2:
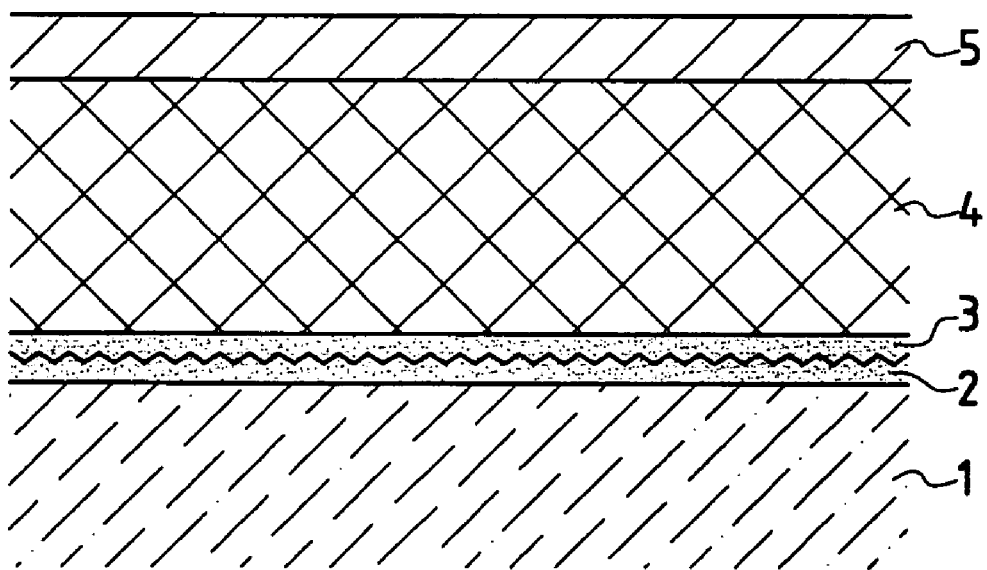
FIG. 2 is an OLED device incorporating the material of the present invention.

FIG. 2 is a diagram of such an OLED device with the material of the invention making up its anode side. The layer 3 is overlaid with a section 4 having of at least one light emitting layer and a metal cathode 5.

The materials making up the various light emitting layers 4 as well as the cathode 5 are all currently used in known procedures to make OLED type devices.

According to a final aspect, the invention also relates to a process for manufacturing the materials of the invention and devices containing these materials.

All known techniques of the prior art, which allow two successive layers of a transparent conducting oxide with the required roughness to be deposited on a glass substrate, can be used.

Nevertheless, in order to take into consideration the respective roughnesses of the two successive TCO layers, a sol-gel type deposition is preferably used to deposit the second TCO layer on the substrate previously coated with a first TCO layer which has a roughness of over 1 nm.

In fact, as explained previously, this type of sol-gel depositing process leads to particularly low surface roughness values, in particular below 1 nm.

Generally, the sol-gel depositing step will be followed by a heat consolidation step for the second TCO layer.

Deposition of the first TCO layer, which has a higher roughness value, is generally carried out by means of a vacuum spraying process or by chemical vapour deposition.

Choice of operating conditions should depend on the type of oxides to be deposited and the desired thickness. With regard to sol-gel type deposition, these conditions will be chosen depending on commercial availability of TCO precursors. As an example of precursors for tin oxide deposits, one can choose from $SnCl_2(OAc)_2$, $SnCl_2$, an alcoxide of Sn(II) such as $Sn(OEt)_2$, Sn(II)ethyl-2-hexanoate, $SnCl_4$, an alcoxide of Sn(IV) such as $Sn(OtBu)_4$. Any salt or organometallic compound known to be a precursor of tin can also be used. In the case of antimony oxide deposition, all precursors conventionally used for depositing antimony oxides can be used. These are organometallic compounds and their salts, particularly alcoxides of Sb(III) and chlorides such as $SbCl_3$ or $SbCl_5$.

In general, as metal oxide precursors, any conventionally used compounds can be employed. In particular, organometallic compounds or salts of these metals can be used. More precisely, metal oxide precursors are used in solution or in suspension in an organic solvent, for example a volatile alcohol. Examples of volatile alcohols include C1 to C10 alcohols, straight or branched, particularly methanol, ethanol, hexanol and isopropanol. Glycols can also be used, especially ethylene glycol or volatile esters such as ethyl acetate.

The composition used to deposit an oxide layer can advantageously include other constituents, particularly water or a stabilising agent such as diacetone alcohol, acetyl acetone, acetic acid and formamide.

The thin layer can be deposited by means of any process known to the one skilled in the art used to make a coating layer from a fluid composition. This thin-layer deposition can be achieved either by immersing the substrate to be coated in a precursor solution or by applying the solution to the substrate by centrifugation, or by means of a process whereby the solution is sprayed onto the substrate surface.

Generally, the deposited layer then undergoes heat treatment, usually between 22 and 150° C., advantageously at a temperature in the order of 60° C., followed by heat treatment at a temperature in the range of 450 to 600° C. for 2 minutes to 1 hour, advantageously at a temperature in the order of 550° C. for about 15 minutes.

As said above, a sol-gel type process is advantageously used to deposit the second TCO layer such that, in particular, smoothing is achieved, thus leading to the required low roughness. Using a deposition technique for the TCO layer based on a sol-gel type process has the added benefit of making it possible to print on this layer by soft lithography, before it is consolidated, a regular structure and in particular a periodic microstructure in the wavelength range emitted by the emitting layer of an OLED type diode. This considerably reduces light losses at the edges of the diode.

This additional benefit of depositing TCO using a sol-gel type process makes it possible, as is demonstrated in an invention for which a patent application was made on the same day as for this patent, to lessen one of the drawbacks of current OLEDS, i.e. their low light emission efficiency as a result of the fact that the light emitted by the light emitting layer is trapped within the diode structure, on account of the well-known effect of wave guiding, and exits to the outside from the edges of the diode only, a location where this effect is of no use for display applications. In fact, only the light exiting normally to the emission plane through the transparent conducting oxide (TCO) layer is usefully pixelized to form the image displayed by the OLED.

When carrying out deposition using the sol-gel type process, in particular deposition of the second TCO layer, it occurred to the inventors of this invention that, although as a matter of principle the conventional conditions for sol-gel solution deposition could be used, it was frequently advantageous to modify these processes when coating thin substrates, especially in the case of substrates having a thickness of less than 1 mm.

In fact, problems arose during drying of the layer resulting from sol-gel deposition when the substrate was relatively thin, especially under 1 mm thick. This difficulty in drying the coated substrate was found to be worse the thinner the substrate. Different solutions have been proposed to address this type of problem, and are the subject of a patent filed on the same day which relates to an improved process for depositing a layer using a sol-gel type method, particularly on substrates having a thickness of less than 1 mm.

As is shown in the latter copending patent, three solutions have been provided to the problem of depositing layers on relatively thin substrates using a sol-gel type process to avoid the drying problems related to formation of a haze during the evaporation step.

More precisely, the study carried out by the inventors of this invention aiming at resolving these problems showed that it was possible to overcome the difficulties encountered either by changing the solvent or modifying the liquid medium used for the deposit, so as to reduce the heat and/or evaporation rate, or by increasing the temperature of the liquid medium used in the sol-gel process to render drying more uniform, or by heating the sample immediately after coating it with a liquid layer, and before proceeding with evaporation of the liquid medium and consolidation of the deposited layer.

This type of improved process was carried out in the examples thereafter. The examples below are given for purely illustrative purposes and in no way limit the invention.

EXAMPLES

The various materials prepared and used were characterized as follows:

a. Measurement of Film Thickness

Film thickness is determined using a TENCOR P10 type needle surface profiler. The values given below are mean values from seven measurements in different positions.

b. Surface Resistance

Film resistance was measured after 24 hours using the so-called four linear point technique based on gold contacts 2 mm apart. A factor of 4.53 was used to obtain the layer's resistance from the measured resistance, according to the theory.

c. Roughness

Peak-valley roughness ($R_{pv}$) and mean roughness ($R_{rms}$) were determined using a white light interferometer (Zygo New View 5000) and by atomic force microscopy (the so-called AFM technique).

d. Work Function

Measurements were performed using a Kelvin probe (KP-Technology Limited).

e. optical properties

The transmission of samples was measured using a Cary 5E (Varian) type spectrophotometer in the range of 200 to 3000 nm using air as a reference for normal incidence.

Example 1

Glass Support Coated with an ITO Layer and an ATO Layer

1. A 0.7 mm glass substrate coated with a layer of ITO using a vacuum spraying technique and sold by Samsung Corning was used.

The ITO layer has the following properties:
thickness of 192 nm,
surface resistance of 7.6 Ω/□,
mean roughness ($R_{rms}$) measured over 5 μm² of 4.7 nm,
peak-valley roughness ($R_{pv}$) measured over 5 μm² of 31.1 nm,
work function between 4.3 and 4.6 eV,
transmittance of 83% in the visible range.

2. A coating solution is prepared by dissolving tin diacetate dichloride $SnCl_2(OAc)_2$ in ethanol, as well as 4-hydroxy-4-methyl-pentanone (CAS 123-42-2) as a stabilising agent. The relative amounts of tin and antimony are calculated to give final doping of 7 mol-%. The relative stabilising agent concentration with respect to tin is 2 mol-%. Ethanol is added to achieve a final tin concentration of 0.5 mol/l.

This coating solution is deposited by immersing the substrate in this medium at a temperature of 25° C. with a removal rate of 24 cm/min.

After depositing a single layer of ATO, the coated substrate is heated to 550° C. for 15 minutes.

The coating properties are as follows:
surface resistance: 17 to 20 Ω/□,
optical transmittance: 82%,
work function: 4.8 to 5.2 eV,
coating thickness: 108 nm (+192 nm for ITO),
mean roughness ($R_{rms}$): 0.4 nm in a 100 nm² square,
peak-valley roughness ($R_{pv}$): 3.8 nm in a 100 nm² square.

Example 2 (Comparative)

For comparative purposes, a layer of ATO from the same precursor solution as that used in example 1, is deposited directly on a glass substrate similar to the one in example 1 but not coated with an ITO layer, under the same deposition and heat treatment conditions.

Coatings with the following properties were obtained:
surface resistance: 1890 Ω/□,
optical transmittance: 85%,
work function: 4.8 to 5.2 eV,
coating thickness: 108 nm,
mean roughness ($R_{rms}$) in a 100 nm² square: 1 nm,
peak-valley roughness ($R_{pv}$) in a 100 nm² square: 3.6 nm.

Example 3 (Comparative)

For comparative purposes, 8 successive layers of ATO from the same precursor solution as that used in example 2 are deposited directly on a substrate similar to the one in example 2, under the same deposition and heat posttreatment conditions.

Coatings with the following properties were obtained:
surface resistance: 50 to 55 Ω/□,
optical transmittance: 65%,
work function: 4.8 to 5.2 eV,
coating thickness: 600 nm,
mean roughness ($R_{rms}$) in a 100 nm² square: 2.5 nm,
peak-valley roughness ($R_{pv}$) in a 100 nm² square: 8 nm.

The characteristics of the various supports coated with only an ITO layer as well as coated supports according to example 1 of the invention (ATO/ITO) and according to both comparative examples 2 and 3 are given in the table below:

|  | ITO | ATO/ITO Example 1 | ATO Example 3 | ATO Example 3 |
|---|---|---|---|---|
| Surface resistance (Ω/□) | 7.6 | 7 | 1890 | 50–55 |
| Optical transmittance (%) | 83 | 82 | 85 | 65 |
| Work function (eV) | 4.3–4.6 | 4.8–5.2 | 4.8–5.2 | 4.8–5.2 |
| Coating thickness (nm) | 192 | 45/192 | 108 | 600 |
| $R_{rms}$ (nm) | 4.7 | 0.4 | 1 | 2.5 |
| $R_{pv}$ (nm) | 31.1 | 3.8 | 3.6 | 8 |

The present invention has been described generally and in detail by way of examples and figures. Persons skilled in the art, however, will understand that the invention is not limited necessarily to the embodiments specifically disclosed, but that modifications and variations can be made without departing from the spirit of the invention. Therefore, unless changes otherwise depart of the scope of the invention as defined by the following claims, they should be construed as being included herein.

We claim:

1. A material comprising:
   a glass or vitroceramic substrate;
   a first layer deposited on one side of said substrate comprising at least one transparent conducting oxide, said second layer being hereafter called the first TCO layer;
   a second layer deposited on said first TCO layer comprising at least one transparent conducting oxide, said second layer hereafter called the second TCO layer, both TCO layers being such that:
   said first TCO layer has a roughness of more than 1 nm and said second TCO layer has a roughness less than or equal to 1 nm;
   the work function of said second TCO layer is greater than the work function of said first TCO layer and is greater than 4.6 eV; and
   transmittance of the material in the visible wavelength range is at least 80%.

2. The material according to claim 1, wherein said work function of said second TCO layer is greater than 4.8 eV.

3. The material according to claim 1, wherein said first and second TCO layers include an oxide of at least one metal chosen from the group consisting of tin, zinc, indium and cadmium.

4. The material according to claim 1, wherein said first TCO layer includes an oxide selected from the group consisting of:
indium oxide doped with tin ($In_2O_3$:Sn), hereafter called ITO,
tin oxide doped with fluorine ($SnO_2$:F),
zinc oxide doped with aluminium (ZnO:Al),
tin oxide doped with antimony ($SnO_2$:Sb).

5. The material according to claim 3, wherein said second TCO layer is comprised of at least one oxide selected from the group consisting of:
$SnO_2$
$SnO_2$:F
$SnO_2$:Sb
$In_4Sn_3O_{12}$
$Zn_2In_2O_5$
$ZnSnO_3$
$Zn_2SnO_4$
$GaInO_3$
$MgIn_2O_4$.

6. The material according to claim 3, wherein said second TCO layer is a layer of tin oxide doped with antimony (ATO), $SnO_2$:Sb.

7. The material according to claim 1, wherein a thickness of said second TCO layer is between 30 and 200 nm.

8. The material according to claim 7, wherein the thickness of said second TCO layer is between 50 and 150 nm.

9. The material according to claim 7, wherein a thickness of said substrate is between 0.1 and 3 mm.

10. A luminous display device comprising an anode side and a cathode, said anode side including said material of claim 1.

11. The luminous display device according to claim 10, wherein said device is an organic light emitting diode (OLED) incorporating at least one light emitting layer inserted between the second TCO layer and said cathode.

12. The material according to claim 3 wherein said at least one metal is combined with at least one element from the group consisting of gallium, antimony, fluorine, aluminium, magnesium and zinc.

* * * * *